United States Patent

Prins

[11] Patent Number: 5,994,208
[45] Date of Patent: Nov. 30, 1999

[54] DOPING IN CRYSTALLINE DIAMOND SUBSTRATES

[76] Inventor: Johan Frans Prins, 8 Portland Place, Northcliff, South Africa

[21] Appl. No.: 08/935,000

[22] Filed: Sep. 22, 1997

Related U.S. Application Data

[63] Continuation of application No. 08/668,789, Jun. 21, 1996, abandoned.

[30] Foreign Application Priority Data

Jun. 23, 1995 [ZA] South Africa ............ 95/5217

[51] Int. Cl.⁶ .................................. H01L 21/265
[52] U.S. Cl. .......................................... 438/527
[58] Field of Search .................... 438/527, 528; 527/533, 526, 530, 140

[56] References Cited

U.S. PATENT DOCUMENTS

| | | | |
|---|---|---|---|
| 4,277,293 | 7/1981 | Nelson et al. | 438/105 |
| 4,976,987 | 12/1990 | Musket et al. | 427/528 |
| 5,034,784 | 7/1991 | Yamazaki | 438/47 |
| 5,075,764 | 12/1991 | Yamazaki | 438/47 |
| 5,252,498 | 10/1993 | Yamazaki | 438/54 |
| 5,254,862 | 10/1993 | Kalyankjumar et al. | 257/611 |
| 5,318,915 | 6/1994 | Baliga et al. | 438/520 |
| 5,328,855 | 7/1994 | Kitabatake et al. | 438/795 |
| 5,338,945 | 8/1994 | Bacig et al. | 437/607 |
| 5,385,762 | 1/1995 | Prins | 427/533 |
| 5,543,637 | 8/1996 | Baliga | 257/77 |
| 5,578,507 | 11/1996 | Kuroi | 438/474 |
| 5,609,926 | 3/1997 | Prins | 427/523 |

FOREIGN PATENT DOCUMENTS

| | | |
|---|---|---|
| 0209257 | 1/1987 | European Pat. Off. . |
| 0573312 | 12/1993 | European Pat. Off. . |

OTHER PUBLICATIONS

"Doping of Diamond by Coimplantion of Carbon and Boron"; Sandhu et al, App. Phys. Letts 55(14) Oct. 2, 1989 pp. 1397–1399.

*Primary Examiner*—Savitri Mulpuri
*Attorney, Agent, or Firm*—Scully, Scott, Murphy & Presser

[57] ABSTRACT

A crystalline substrate such as diamond, cubic boron nitride or silicon carbide is doped with a dopant atom such as boron, phosphorus or arsenic. The method includes the steps of creating a first damaged layer containing vacancies and interstitial atoms in the crystal lattice of the crystalline substrate, implanting the dopant atoms under conditions to create a second damaged layer separate from the first damaged layer and containing the dopant atoms, and causing the dopant atoms in the second layer to diffuse out of that layer and into vacancies in the first layer and thereby occupy substitutional positions in that layer.

15 Claims, 2 Drawing Sheets

DOPING IN CRYSTALLINE DIAMOND SUBSTRATES

This application is a continuation of application Ser. No. 08/668,789 filed Jun. 21,1996, now abandoned.

BACKGROUND OF THE INVENTION

This invention relates to the doping of crystalline substrates.

The doping of crystalline substrates such as silicon carbide, diamond and other such materials to provide such substrates with semi-conducting properties and/or optically active centres, is well established in the art. Dopant atoms can be introduced into the substrate by using ion implantation techniques.

European Patent Publication No. 0 209 257 discloses a method of producing a doped diamond which includes the steps of bombarding the diamond with ions of a suitable energy to produce a damaged layer of point defects in the form of vacancies and interstitials within the crystal lattice, the bombardment being carried out at a temperature sufficiently low to inhibit diffusion of the point defects, followed by annealing the damaged substrate. Dopant atoms are introduced into the damaged layer by ion implantation during, before or after the damage-creating bombardment. The dopant atom implantation also takes place at a temperature sufficiently low to inhibit diffusion of the point defects in the damaged layer.

European Patent Publication No. 0 573 312 discloses a method of producing a doped diamond which includes the steps of creating a damaged layer of point defects in the form of vacancies and interstitial atoms within the crystal lattice of the diamond using low dose ion implantation at low temperature, introducing dopant atoms into the damaged layer using low dose ion implantation at low temperature, rapidly annealing the product to reduce lattice damage and to cause dopant interstitial atoms to diffuse into lattice positions, and repeating the doping and rapid annealing steps until a doped diamond having a desired amount of dopant is produced.

In the methods described above, the implanting of the diamond substrate is at a temperature low enough to "freeze" the implanted atoms and intrinsic point defects (vacancies and interstitials) which are created during the implantation process, such that they cannot diffuse out of the implanted layer being created. The temperature required for diamond is preferably well below room temperature and typically liquid nitrogen temperatures. In order to get a good intermix of implanted atoms, vacancies and self-interstitials, and a large width for the implanted layer, the ions are usually implanted at a series of different energies and doses at these energies. This cold implantation step is then followed by annealing (usually rapid annealing) at a suitable temperature. The implanted atoms which combine with vacancies then become activated dopant atoms, and the self-interstitials, which similarly combine with vacancies, reduce the implantation damage.

The width of the implanted layer, and vacancy density in it, are important to this method because some of the implanted dopant atoms and self-interstitials can escape and diffuse away before recombining with the vacancies in the layer, thus leaving behind a residue of these vacancies.

Unfortunately, vacancies in diamond are optically and electrically active and have thus, in most cases, a deleterious effect on the required properties of the doped layer. Even if they were not optically or electrically active, their presence leads to scattering of charge carriers which is undesirable in high quality doped materials. Although further annealing at higher temperatures usually reduce these undesired effects, it has not been possible to remove them altogether by, for example, enticing all the vacancies to diffuse out of the layer. This is prevented by the tendency of the vacancies to agglomerate and form more complex defects which, like the single vacancies, are usually deleterious. Thus, it is desirable to prevent the interstitial atoms (both dopant and self) diffusing away before recombining with vacancies. Obviously, the wider the implanted layer and the more vacancies it contains, the lower the fraction of interstitials (both dopant and self) which can escape. However, to increase the vacancy density requires larger ion doses which, in turn, also create more interstitials, and although a larger fraction of these interstitials now combine with vacancies, it has been found that the total amount of interstitials escaping increases, which, in this way, leaves behind an even larger density of vacancies in the implanted layer. If, on the other hand, very low ion doses are used to diminish the total density of residual vacancies, the fraction of implanted dopant interstitials which can escape, increases, and too few activated dopant atoms may remain.

SUMMARY OF THE INVENTION

According to a first aspect of the invention, a method of doping a crystalline substrate having a crystal lattice includes the steps of providing the substrate, creating a first damaged layer containing vacancies and interstitial atoms in the crystal lattice, implanting dopant atoms under conditions to create a second damaged layer separate from the first damaged layer and containing the dopant atoms, and causing the dopant atoms in the second layer to diffuse out of that layer and into vacancies in the first layer to occupy substitutional positions in that layer.

According to a second aspect of the invention, a method of doping a crystalline substrate having a crystal lattice includes the steps of providing the substrate, creating a first damaged layer, by means of ion implantation of the dopant atoms, which will contain vacancies, implanting atoms under conditions to create a second damaged layer separate from the first damaged layer and causing interstitial atoms in the second layer to diffuse out of that layer into the first layer in order to combine with vacancies in the first layer, thus reducing the damage.

DESCRIPTION OF EMBODIMENTS

Figure 1:
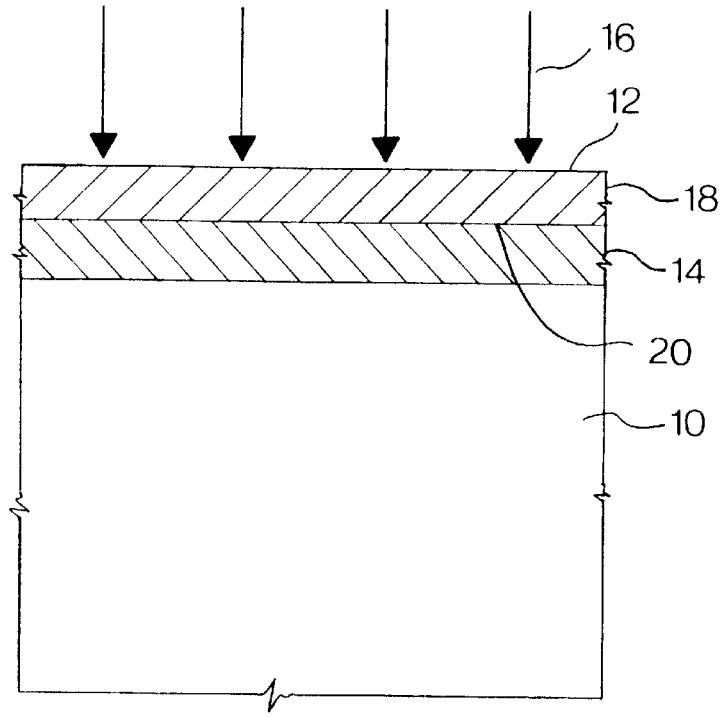
FIG. 1 illustrates diagrammatically an embodiment of the invention.

The method of the invention, according to the first aspect, involves creating a first damaged layer which can be described as a vacancy layer, creating a second and separate damaged layer containing a relatively high concentration of dopant atoms and causing the dopant atoms in the second layer to diffuse out of that layer and into substitutional positions in the crystal lattice of the vacancy layer.

The first and second layers will be separate one from the other and may be entirely separate or discrete from each other or may have an overlapping region.

The advantage of this method is that the residual damage remaining after doping can be greatly reduced. Therefore the first, or vacancy layer, is preferably created using a low dose implantation giving rise to a low density of vacancies. Typically, the density of vacancies in the first layer will be less than $5 \times 10^{20} cm^{-3}$, i.e. less than 0,3 atomic percent. Preferably light atoms such as boron, carbon or helium are used in the ion implantation to create the first damaged layer. For example, if the damaged layer is created by implantation of boron ions at energies less than 170 keV, the dose used may be as low as $5 \times 10^{12} cm^{-2}$ and even lower. This low dose ion implantation may be, and preferably is, followed by a rapid anneal. The rapid anneal must take place at a temperature which can allow interstitials to diffuse, but not the vacancies. Rapid anneal means that the annealing temperature is reached in time of less than 2 minutes or even as fast as 20 seconds, and preferably in a time of less than 5 seconds. Typically, the anneal temperature will be in the range of 50° C. to 900° C. and will vary according to the prevailing conditions, e.g. whether or not the diamond is being subjected to implantation at the time.

The second damaged layer contains dopant atoms and generally in any high concentration needed. To achieve this, a high dose ion implantation may be used, for example, a dose of at least $1 \times 10^{15} cm^{-2}$ and typically a dose higher than $1 \times 10^{16} cm^{-2}$.

The second damaged layer is separate from the vacancy layer and may be created at a shallower depth than the vacancy layer, at a deeper depth than the vacancy layer or on each of opposite sides of the vacancy layer. The second damaged layer is preferably created at a depth shallower than the first damaged layer or on the sides of the damaged layer. In such cases, the second damaged layer, after diffusion of the dopant atoms into the first damaged layer, can be removed. For example, if the substrate is diamond, the second damaged layer can be removed by rendering the diamond in that layer amorphous followed by removal of the now amorphous layer. The diamond can be rendered amorphous by ion implantation, typically under conditions of high ion dose and temperatures below 200° C. Removal of the amorphous layer can be achieved by use of an acid such as chromic, hydrochloric, sulphuric or nitric acid or a mixture of two or more of these acids, heating the diamond in air or oxygen at temperatures of 350 to 800° C., using reactive ion etching in a plasma or other such method known in the art.

The dopant atoms in the second layer are caused to diffuse out of that layer and into substitutional positions in the crystal lattice of the vacancy layer. This may be achieved in any one of a variety of ways. First, annealing can be used at a temperature which causes the dopant atoms to diffuse, but not the vacancies. Typically, an annealing temperature of less than 600° C. will achieve this. This annealing may take place during implantation and creation of the second damaged layer or afterwards. Second, in the case of dopant atoms which are electrically charged, an electric field may be applied to drive the dopant atoms into the vacancy layer. Third, an alternating electric field may be used to sweep dopant atoms, again electrically charged, repeatedly through the vacancy layer thus increasing their chance to encounter vacancies. The latter two methods may be carried out in combination and each or both optionally simultaneously with annealing.

The method of the invention, according to the second aspect, differs in that the dopant atoms are already present in the vacancy layer where they will be activated during a subsequent annealing cycle, either before or after the second layer is created. Atoms from the second layer, e.g. carbon atoms in the case of diamond, will then diffuse into the first layer where they can combine with the vacancies and reduce the damage.

The substrate will typically be a large band gap hard crystalline material such as diamond, cubic boron nitride or silicon carbide.

The dopant atoms will typically be boron, phosphorus, arsenic or other atom which imparts electrical or optical properties to the substrate.

FIG. 1 illustrates diagrammatically or schematically an embodiment of the invention. Referring to this figure, a crystalline substrate 10 is provided and has an outer face or surface 12. A first damaged layer 14 containing vacancies and interstitial atoms in the crystal lattice is produced by ion implantation through the surface 12 and in the direction of the arrows 16. A low dose implantation will be selected at an energy ensuring that the layer 14 is produced at a predetermined distance below the surface 12.

Thereafter, a second damaged layer 18 is created by ion implanting dopant atoms again through the surface 12 and in the direction of the arrows 16. The energy of the ion implantation is chosen to create the layer 18 above the layer 14, i.e. at a shallower depth than the layer 14. The two layers are separate and discrete, or may overlap, having a common interface or overlapping region 20.

Thereafter, dopant atoms from the layer 18 are caused to diffuse out of that layer and into vacancies in the layer 14 and thereby occupy substitutional positions in that layer. The layer 18 may now be removed leaving a substrate having a layer 14 in which dopant atoms occupy a substantial number of substitutional positions. There is only limited damage to the substrate in that layer.

The invention will be further illustrated by the following examples.

EXAMPLE 1

Boron ions were implanted while maintaining a type IIa diamond substrate at liquid nitrogen temperature. Different energies (ranging from 170 keV down to 40 keV) and ion doses were used to create a damaged layer which, according to range and damage calculations, consisted of an even distribution of vacancies and self-interstitials over a width of about 0.2 $\mu$m. The total ion dose used was $1 \times 10^{11} cm^{-2}$. This was followed by a rapid anneal to 500° C. for 30 minutes. This procedure did not activate enough boron to give low resistance conduction. In fact the remaining vacancies far outstrip the activated boron atoms, thus compensating them from showing any electrical activity. A vacancy layer having a density of vacancies of about $5 \times 10^{17}$ vacancies/cm$^3$ had been created.

The diamond was then cleaned and remounted for further implantation. The implantation was done while maintaining the diamond substrate at 400° C. and boron ions of 30 keV were implanted to an ion dose of $5 \times 10^{16} cm^{-2}$. At this temperature the implanted boron atoms can diffuse and some of them diffused into the previously prepared, deeper lying vacancy layer. The high dose used created many boron interstitials, thus enhancing the probability that the underlying vacancies would be filled by them.

This implantation was then followed by carbon ion implantation to a dose of $6 \times 10^{16} cm^{-2}$ at 45 keV which created a damaged layer stretching deeper than the one created by the 30 keV boron implantation, and which at room temperature amorphised the diamond from the surface through which ion implantation occurred to the depth of the second damaged layer. This was followed by annealing and etching in a suitable acid solution to remove the amorphised diamond layer. What remained was the underlying, treated vacancy layer. Ohmic contacts were prepared to this surface and the resistance of the layer studied. The layer had a low resistance (about $5\times10^8$ ohm/square) and conducted by hopping, which indicated that it was highly overdoped by boron.

EXAMPLE 2

Phosphorus doping of diamond has been attempted many times before. In a previous study it was found that phosphorus can be activated via the cold implantation/rapid annealing (CIRA) technique, provided the ion dose is kept very low. At higher doses the layer probably contains too much strain for the phosphorus and vacancies to combine and the remaining vacancies form too may defects which interfere with the electrical behaviour of the phosphorus which have been activated.

Two identical type IIa diamond substrates were used. Both were treated to the same CIRA doping step as follows: Phosphorus was implanted at different energies and doses to create a vacancy and interstitial layer in each of them which had the same width and distribution of these defects as the low ion dose boron implanted layer in Example 1. This was followed by a rapid anneal to 600° C. for both diamonds. One of the diamonds was then further treated following the method of the present invention. In this case the diamond was again cleaned and mounted for implantation. Implantation was done while maintaining the diamond surface at 400° C. It was then implanted with argon ions at 30 keV to an ion dose of $5\times10^{16} cm^{-2}$. The argon ions are very large and do not diffuse significantly at this temperature. However, they create a strained layer near the surface of the diamond containing many self-interstitials which can diffuse and move into the underlying vacancy layer. When they combine with the vacancies, they reduce the residual damage. After this implantation, the diamond was further bombarded with argon ions of 50 keV at room temperature in order to amorphise the previously shallow implanted layer. Both diamonds were again annealed at 600° C. followed by etching in a suitable acid solution. This etching removed the amorphised layer on the second diamond. The diamonds were subjected to the same higher temperature anneals, and their electrical characteristics compared. In both cases electrical conductance caused by the phosphorus could be measured but in the case of the diamond which had been fully treated according to the present invention, the resistance was an order of magnitude lower.

EXAMPLE 3

(i) A polished, high purity type IIa diamond was mounted for ion implatation, cooled to liquid nitrogen temperature, and implanted with boron ions using consecutively the following energies and ion doses:

TABLE 1

| Energy (keV) | Dose (cm$^{-2}$) | Energy (keV) | Dose (cm$^{-2}$) |
| --- | --- | --- | --- |
| 130 | $3.75 \times 10^9$ | 70 | $6.3 \times 10^8$ |
| 110 | $1.25 \times 10^9$ | 60 | $6.2 \times 10^8$ |
| 100 | $6.2 \times 10^8$ | 50 | $6.3 \times 10^8$ |
| 90 | $6.3 \times 10^8$ | 40 | $6.2 \times 10^8$ |
| 80 | $6.2 \times 10^8$ | 30 | $6.3 \times 10^8$ |

TOTAL ION DOSE: $1 \times 10^{10}$ cm$^{-2}$

This followed by a rapid thermal anneal to 500° C., at which temperature the diamond was held for 30 minutes to create a damaged layer of about 0,2 μm, containing a low density of vacancies, i.e. a density of about $5\times10^{16} cm^{-3}$. The vacancy distribution was reasonable uniformly distributed over the width of the layer. The low ion doses used are about three to four orders of magnitude less than usually employed when doping materials by ion implantation.

After this first step the diamond was cleaned and remounted for the drive-in implantation of boron-dopant interstitials. The following implantation steps were then used:

TABLE 2

| Temperature (° C.) | Ion type | Energy (KeV) | Dose (cm$^{-2}$) |
| --- | --- | --- | --- |
| 400 | B$^+$ | 30 | $5 \times 10^{16}$ |
| 400 | C$^+$ | 47 | $5 \times 10^{16}$ |
| 100 | C$^+$ | 47 | $3 \times 10^{16}$ |

During the first implantation the boron ions were implanted at a shallow depth of about 0,05 μm, which is much less than the depth of the underlying vacancy-damaged layer. The high ion dose ensured that at least some of the implanted boron interstitials, which can diffuse at 400° C., would be forced into the vacancy-damaged layer. The subsequent carbon-ion implantation (also at 400° C.) was slightly deeper than the boron implantation and should have detrapped some of the boron atoms in the shallower layer, thus allowing more boron ions to enter the vacancy-damaged layer. Furthermore, some carbon interstitials would also have entered this layer and may have recombined with vacancies, thus further decreasing the residual damage. The implantation of carbon ions at 100° C., caused the latter C+ implanted layer to amorphise. This was followed by an anneal at 600° C. to graphitise the amorphised upper layer, which could then be etched off with a suitable acid solution, e.g. inorganic acids such as hydrochloric, sulphuric or nitric acids or mixtures thereof, thus leaving only the underlying, vacancy-damaged layer which had not been damaged further by the drive-in implantations.

Figure 2:
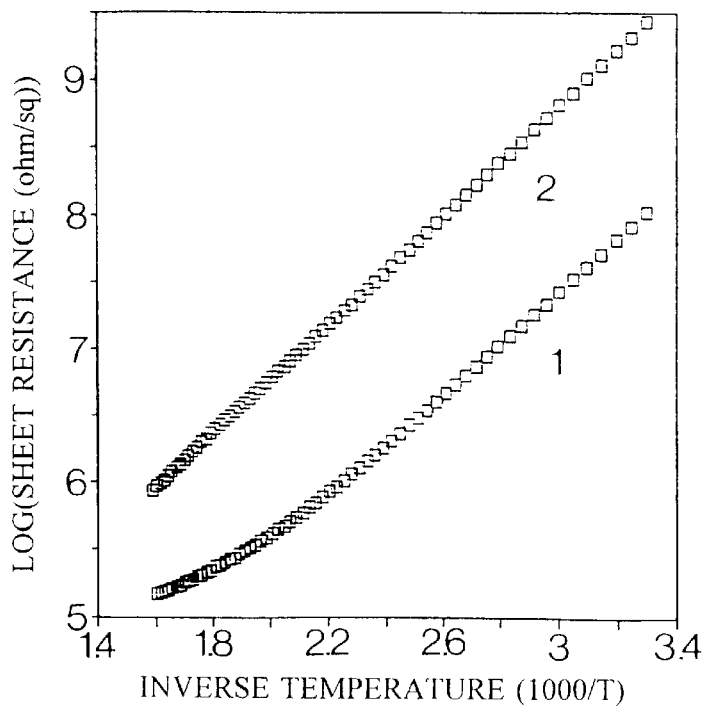
FIGS. 2 to 4 illustrate graphically the results of electrical conduction experiments carried out on diamonds doped using embodiments of the method of the invention.

Ohmic contacts were then made to the diamond surface and the resistance monitored as a function of isochronal anneals, each lasting 30 minutes, at the temperatures 800, 950, 1100, 1250, 1400 and 1550° C. It is known that the higher the temperature at which the diamond has been annealed, the less deep-lying donors are formed by the residual vacancies which can compensate the activated boron acceptors. The resistance behaviour of the diamond as a function of temperature, after the final anneal at 1550° C., is shown in FIG. 2 by curve 1. It is commensurate with boron-doped diamond in which the boron acceptors are not highly compensated.

(ii) The same diamond was then repolished, cleaned and mounted for ion implantation. Exactly the same implantations scheme was used as outlined above, except that after the 600° C. anneal, the diamond was not isochronally annealed, but directly heated to 1550° C. The resistance behaviour obtained in this case is shown in FIG. 2 by curve 2, which clearly differs from curve 1. In this case the behaviour is typically of a boron doped diamond which is highly compensated by deeper lying donor centres. Thus, the direct anneal to 1550° C. caused the residual vacancies to form more compensating donors than the isochronal annealing sequence. This is not unexpected, because the manner in which vacancies will agglomerate to form more complex defects should be a function of their annealing history.

EXAMPLE 4

(i) A lighter ion, which creates less vacancies per ion during implantation and can penetrate deeper into the substrate for the same implantation energy as a heavier ion, was used to create an initial, low-damage vacancy region. Inert helium ions were chosen and implanted over a range of energies stretching from 170 keV down to 30 keV, in order to create a uniformly damaged layer from a depth of about 0,2 μm down to about 0,5 μm. The vacancy density of the layer was about $5 \times 10^{16}/cm^3$. The diamond was held at liquid nitrogen temperature, and the total ion dose used was $5 \times 10^{10} cm^{-2}$ followed by rapid thermal annealing to 600° C. for 30 minutes. Afterwards, the diamond was again cleaned and remounted for the drive-in implantation using the conditions, in sequence, as shown in Table 3.

TABLE 3

| Temperature (° C.) | Ion type | Energy (keV) | Dose (cm$^{-2}$) |
|---|---|---|---|
| 400 | B$^+$ | 30 | $5 \times 10^{16}$ |
| 400 | B$^+$ | 38 | $5 \times 10^{16}$ |
| 400 | B$^+$ | 45 | $5 \times 10^{16}$ |
| 400 | B$^+$ | 53 | $5 \times 10^{16}$ |
| 400 | B$^+$ | 60 | $5 \times 10^{16}$ |
| 100 | C$^+$ | 110 | $7 \times 10^{16}$ |

Thus the total B$^+$ ion dose can to $2,5 \times 10^{17} cm^{-2}$ and the different ion energies were used in an attempt to force more of the implanted boron interstitials into the underlying He+ damaged layer. The last C$^+$ implantation at 100° C. was done to amorphise the surface region into which the boron ions had been implanted. This implantation sequence was followed by a further anneal at 600° C. to graphitise the amorphised surface region which could then be etched off, as described above, to leave the underlying doped layer behind. The diamond was then subjected to isochronal anneals at 800, 950, 1100, 1250, 1400 and 1550° C.

Figure 3:
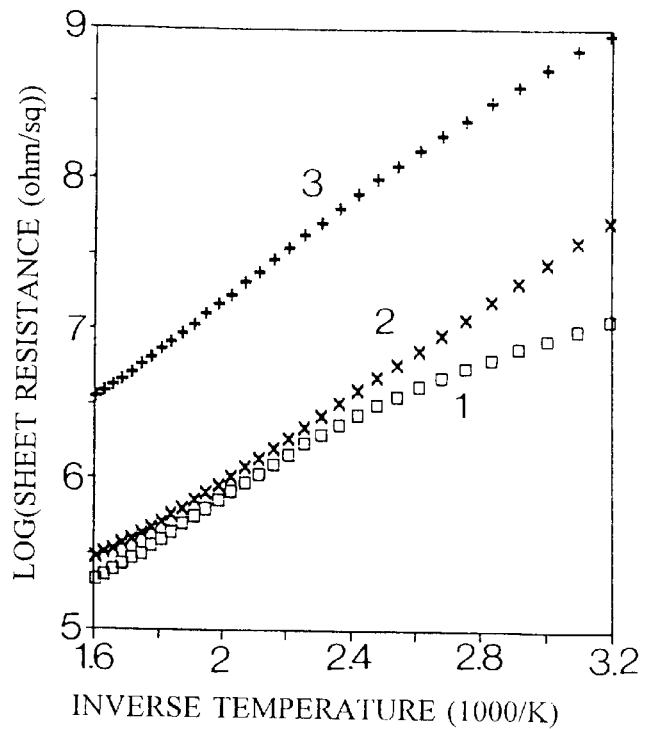

The resistance behaviour that ensued is shown by curve 1 in FIG. 3, and displays, at low temperatures, a lower slope than anticipated, which is indicative of hopping conduction. Such conduction occurs when a semiconductor is over-doped. It is known that this can be achieved in diamond by high dose implantation of boron at a low temperature, to amorphise the diamond's surface, followed by annealing and etching of the graphitised surface. This would indicate that the last C$^+$ implantation did not penetrate deep enough to remove the boron implanted layers completely. A further layer was then stripped from the surface by implanting argon (Ar$^+$) ions at an energy of 50 keV to a dose of $1 \times 10^{16} cm^{-2}$ while keeping the diamond at liquid nitrogen temperature. This was followed by rapid thermal annealing to 1200° C. (which graphitised the Ar+ implanted layer) and etching. The conductivity of the remaining doped layer is shown by curve 2 in FIG. 3, and is clearly what one would expect of a boron-doped diamond layer with low donor compensation.

(ii) The experiment as described above was repeated, except that the C$^+$ implantation step, shown in Table 3, was done at 140 keV in order to strip off a deeper layer. Furthermore, the amorphised layer was not etched off immediately after the second 600° C. anneal, but only after the whole sequence of isochronal anneals had been completed. The ensuing resistance characteristics are shown by curve 3 in FIG. 3. It is of much higher resistance and again indicative of very high compensation of the activated boron acceptors. By repeating the experiment, using the 140 keV C$^+$ carbon stripping, and etching off this layer before doing the isochronal annealing sequence, a well-doped layer could be obtained. Thus, the presence of the amorphised layer during the isochronal annealing, affects the vacancy interactions when they agglomerate to form more complex defects. This is not surprising as such an overlayer could cause severe strain in the underlying diamond substrate.

EXAMPLE 5

(i) Carbon-ion implantation was used to create the initial damaged layer containing a low density of vacancies. The implantations were done while keeping the diamond at liquid nitrogen temperature, and the energies and doses used are shown in sequence in Table 4.

TABLE 4

| Energy (keV) | Dose (cm$^{-2}$) | Energy (keV) | Dose (cm$^{-2}$) |
|---|---|---|---|
| 170 | $1.8 \times 10^{11}$ | 90 | $3.0 \times 10^{10}$ |
| 140 | $6.0 \times 10^{10}$ | 77 | $3.0 \times 10^{10}$ |
| 128 | $3.0 \times 10^{10}$ | 64 | $3.0 \times 10^{10}$ |
| 116 | $3.0 \times 10^{10}$ | 51 | $3.0 \times 10^{10}$ |
| 103 | $3.0 \times 10^{10}$ | 37 | $3.0 \times 10^{10}$ |

TOTAL ION DOSE: $4.8 \times 10^{11} cm^{-2}$

This is followed by rapid thermal annealing to 600° C. for 30 minutes. These implantations caused the same vacancy distribution as had been obtained with the boron implantations in Table 1. However, the vacancy density is higher, i.e. about $4,5 \times 10^{18}/cm^3$ owing to the fact that the heavier carbon ions were implanted to a higher dose.

The diamond was then cleaned and mounted under a metal mast connected electrically to ground potential for the drive in implantations shown in Table 5:

TABLE 5

| Temperature (° C.) | Ion type | Energy (keV) | Dose (cm$^{-2}$) |
|---|---|---|---|
| 400 | P$^+$ | 30 | $5 \times 10^{16}$ |
| 100 | P$^+$ | 40 | $5 \times 10^{16}$ |

The last implantation at 100° C., amorphised the shallower phosphorus implanted layers. This was followed by a further anneal at 600° C. for 30 minutes and removal of the amorphised layer by etching. Ohmic contacts were achieved by suitably damaging the contact areas with a further P$^+$ implantation, and baking on silver paint at 350° C. The layer conducted with a sheet resistance of $3,5 \times 10^{12} \Omega/\square$.

The same diamond was then repolished cleaned and subjected to the same implantations shown in Table 4 followed by rapid annealing to 600° C., in order to create an identical, initial, low-damaged layer as used above. However, in this case argon ions were used to effect the drive-in implantation, using the conditions shown in Table 6:

TABLE 6

| Temperature (° C.) | Ion type | Energy (keV) | Dose (cm$^{-2}$) |
|---|---|---|---|
| 400 | Ar$^+$ | 36 | $4.15 \times 10^{16}$ |
| 100 | Ar$^+$ | 49 | $4.15 \times 10^{16}$ |

These implantations caused the same amount and distribution of damage as the P$^+$ implantations shown in Table 5. By annealing at 600° C. and etching off the amorphised layer, the diamond underwent exactly the same treatment as before except that in this case inert argon ions were used during the drive-in implantations instead of phosphorus. After preparing ohmic contacts in the same way as described above, the resistance of this layer was evaluated, and found to be more than two orders of magnitude higher than obtained for the phosphorus implantation. Conduction also occurred by hopping indicating damage-conduction.

The same diamond was then repolished, cleaned and mounted for implantation. Again it was subjected to exactly the same implantation procedure as during the first experiment on it, except that in this case the phosphorus ion dose used at 400° C. (see Table 5) was increased by a factor of 10 to $5\times10^{17}\text{cm}^{-2}$. The sheet resistance found in this case was $6\times10^{11}$ Ω/□, which is six times lower than measured when the P+ dose was only $5\times10^{16}\text{cm}^{-2}$.

Clearly, conduction at relatively low resistances only occurred when phosphorus implantations were used, and the resistance decreased when increasing the phosphorus ion dose. This proves conclusively that the conduction is caused by the presence of phosphorus and that phosphorus doping had been achieved.

Figure 4:
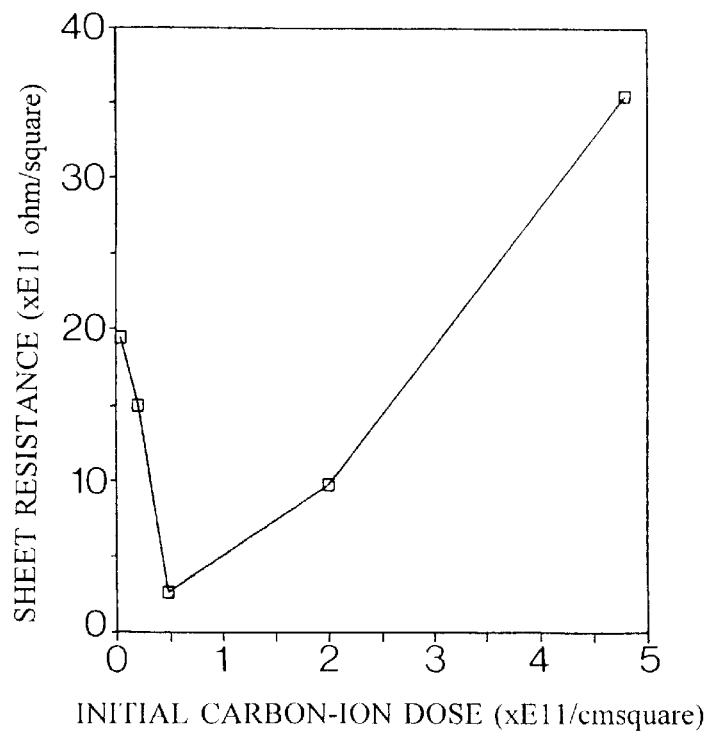

(ii) In further experiments, the amount of damage introduced in the initial layer was varied, while keeping the drive-in implantations the same. The implantation scheme in Table 4 was used but the doses were decreased, in ratio, to decrease the total C+ ion dose, and thus also the vacancy density in the layer, but without changing the vacancy distribution. In each case the drive-in implantations were done using the conditions shown in Table 5. The results are shown in FIG. 4.

As can be seen, the resistance of the layers decrease with decreasing C+ ion dose, i.e. with decreasing initial vacancy density, goes through a minimum at a C+ ion dose of about $5\times10^{16}\text{cm}^{-2}$, whence it increases for lower values of the initial damage incurred. By decreasing the initial vacancy density, the ratio of activated dopant atoms to the residual vacancies increases. Thus there are less vacancies available to scatter carriers or form compensating defects. Although the actual density of activated phosphorus atoms decreases, the conductivity increases because less of them are compensated. This occurs until the actual density of phosphorus atoms activated becomes too low to benefit further from the decrease in compensation, whence the resistance of the layer goes through a minimum and starts to increase with further decreases in the initial vacancy density. This proves that the presence of the vacancies are needed to activate the phosphorus atoms, thus strongly indicating that the phosphorus atoms are occupying substitutional sites. It also, again, emphasises the need to keep the initial vacancy density as low as possible.

I claim:

1. A method of doping a crystalline diamond substrate having a crystal lattice comprising the steps of providing a crystalline diamond substrate having a crystal lattice, creating a first damaged layer by ion implantation at a dose effective to create a density of vacancies of less than $5\times10^{20}$ cm$^{-3}$, containing said vacancies and interstitial atoms in the crystal lattice, implanting dopant atoms under conditions effective to create a second damaged layer separate from the first damaged layer and containing the dopant atoms, and causing the dopant atoms in the second layer to diffuse out of that layer and into the vacancies in the first layer by annealing or applying an electric field and thereby occupy substitutional positions in said first damaged layer.

2. A method according to claim 1 wherein the second damaged layer is at a shallower depth than the first damaged layer.

3. A method according to claim 1 wherein the second damaged layer is at a depth deeper than the first damaged layer.

4. A method according to claim 1 wherein a second damaged layer is provided on each of opposite sides of the first damaged layer.

5. A method according to claim 1 wherein the second damaged layer is created at a shallower depth than the first damaged layer and is removed after the dopant atoms have been caused to diffuse into vacancies in the first damaged layer.

6. A method according to claim 5 wherein the substrate is diamond and the second damaged layer, after diffusion of the dopant atoms into the first damaged layer, is rendered amorphous and thereafter removed.

7. A method according to claim 6 wherein the diamond in the second damaged layer is rendered amorphous by ion implantation.

8. A method according to claim 1 wherein the ions for ion implantation are selected from boron, carbon and helium.

9. A method according to claim 1 wherein the second damaged layer is created by ion implantation at a dose of at least $1\times10^{15}\text{cm}^{-2}$.

10. A method according to claim 1 wherein the dopant atoms are caused to diffuse out of the second damaged layer and into the first damaged layer by annealing at a temperature which causes the dopant atoms to diffuse, but not the vacancies.

11. A method according to claim 10 wherein the annealing temperature is less than 600° C.

12. A method according to claim 1 wherein the dopant atoms are electrically charged and an electric field is applied across the substrate to drive the dopant atoms into the first damaged layer.

13. A method according to claim 1 wherein the dopant atoms are electrically charged and an alternating electric field is applied across the substrate to sweep the dopant atoms repeatedly through the first damaged layer.

14. A method according to claim 1 wherein the diamond substrate is a large band gap crystalline material.

15. A method according to claim 1 wherein the dopant atoms are selected from boron, phosphorus, arsenic and other atoms which impart electrical or optical properties to the substrate.

* * * * *